United States Patent
Jia et al.

(10) Patent No.: US 9,783,883 B2
(45) Date of Patent: Oct. 10, 2017

(54) METHOD FOR DEPOSITING ALUMINUM ON A PERMANENT ND—FE—B MAGNET

(71) Applicant: Yantai Shougang Magnetic Materials Inc., Yantai (CN)

(72) Inventors: Daoning Jia, Yantai (CN); Zhongjie Peng, Yantai (CN); Kunkun Yang, Yantai (CN)

(73) Assignee: YANTAI SHOUGANG MAGNETIC MATERIALS INC., Yantai (CN)

( * ) Notice: Subject to any disclaimer, the term of this patent is extended or adjusted under 35 U.S.C. 154(b) by 0 days.

(21) Appl. No.: 15/041,186

(22) Filed: Feb. 11, 2016

(65) Prior Publication Data
US 2016/0237553 A1    Aug. 18, 2016

(30) Foreign Application Priority Data
Feb. 12, 2015    (CN) .......................... 2015 1 0078215

(51) Int. Cl.

| | |
|---|---|
| *C23C 14/16* | (2006.01) |
| *C23C 14/34* | (2006.01) |
| *C23C 14/02* | (2006.01) |
| *C23C 14/32* | (2006.01) |
| *C23C 14/58* | (2006.01) |
| *C23C 14/06* | (2006.01) |
| *C23C 14/35* | (2006.01) |
| *H01F 41/02* | (2006.01) |
| *H01F 1/057* | (2006.01) |

(52) U.S. Cl.
CPC ........ *C23C 14/3414* (2013.01); *C23C 14/022* (2013.01); *C23C 14/0617* (2013.01); *C23C 14/16* (2013.01); *C23C 14/325* (2013.01); *C23C 14/35* (2013.01); *C23C 14/5853* (2013.01); *H01F 41/026* (2013.01); *H01F 1/0577* (2013.01)

(58) Field of Classification Search
CPC ... C23C 14/022; C23C 14/0617; C23C 14/16; C23C 14/325; C23C 14/3414; C23C 14/35; C23C 14/5853; H01F 41/026; H01F 1/0577
USPC ....................................... 204/192.38, 298.41
See application file for complete search history.

(56) References Cited

U.S. PATENT DOCUMENTS

| | | |
|---|---|---|
| 6,251,196 B1 | 6/2001 | Nishiuchi et al. |
| 6,275,130 B1 | 8/2001 | Yoshimura et al. |

(Continued)

FOREIGN PATENT DOCUMENTS

CN    101736304 A    6/2010

*Primary Examiner* — Rodney McDonald
(74) *Attorney, Agent, or Firm* — William H. Honaker; Dickinson Wright PLLC

(57) ABSTRACT

The present invention provides a method for depositing aluminum on a permanent Nd—Fe—B magnet including a step of cooling the chamber and the arc source by feeding a fluid of water at a cooling temperature of between 0° C. and 5° C. through the chamber and the arc source. The method also includes a step of adjusting a target source and a control magnet of the arc source in the chamber of the multi-arc ion plating apparatus to define a predetermined distance of between 1 cm and 10 cm. The step of depositing the film of aluminum further including steps of applying a current of between 50 A and 70 A and an electrical potential of between 100V and 200V to the target source of aluminum and directing the ions of aluminum using the arc source to the purified permanent Nd—Fe—B magnet for a time period of between 0.5 hours and 5 hours.

24 Claims, 1 Drawing Sheet

(56) References Cited

U.S. PATENT DOCUMENTS

| | | |
|---|---|---|
| 6,281,774 B1 | 8/2001 | Nishiuchi et al. |
| 6,326,087 B1 | 12/2001 | Nishiuchi et al. |
| 6,399,147 B2 | 6/2002 | Nishiuchi et al. |
| 6,444,328 B1 | 9/2002 | Nishiuchi et al. |
| 7,391,291 B2 | 6/2008 | Miyata |
| 7,402,226 B2 | 7/2008 | Machida et al. |
| 8,163,106 B2 | 4/2012 | Kikugawa et al. |
| 8,182,619 B2 | 5/2012 | Morimoto et al. |
| 8,823,478 B2 | 9/2014 | Tanaka et al. |

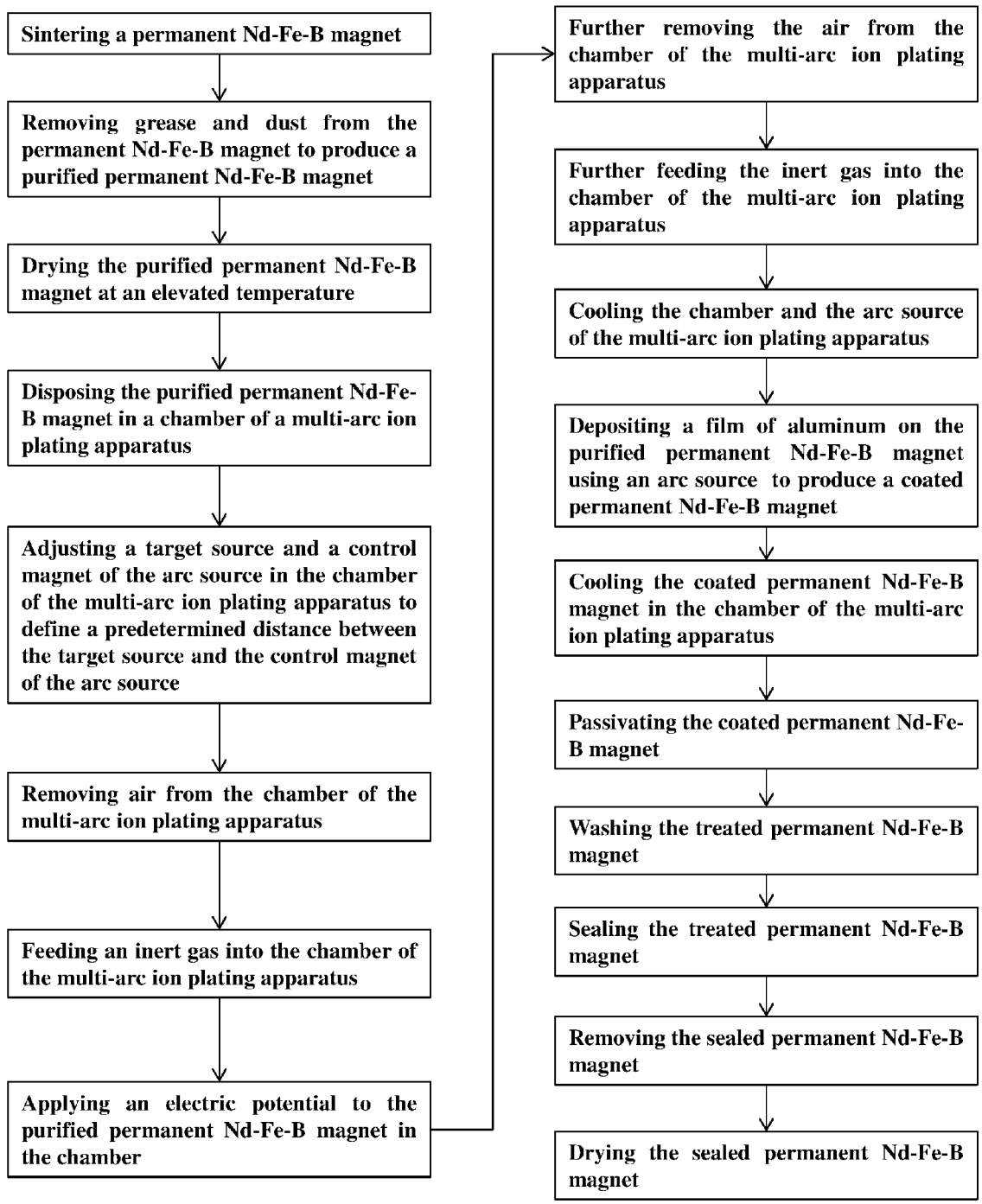

METHOD FOR DEPOSITING ALUMINUM ON A PERMANENT ND—FE—B MAGNET

CROSS REFERENCE TO RELATED APPLICATION

This application claims the benefit of a Chinese application having a serial number of 201510078215.X, published as CN 104651783 A, and filed on Feb. 12, 2015.

BACKGROUND OF THE INVENTION

1. Field of the Invention

The present invention generally relates to a method for depositing aluminum on a permanent Nd—Fe—B magnet.

2. Description of the Prior Art

Because permanent Nd—Fe—B magnets contain large amounts of rare earth elements, the permanent Nd—Fe—B magnets can be easily oxidized when it is exposed to air or under a damp environment. Accordingly, the magnetic properties of the permanent Nd—Fe—B magnets are reduced and, therefore, cannot function properly. In order to prevent oxidation, many manufacturers have deposited an anti-corrosive layer on the surface of the permanent Nd—Fe—B magnets. Because aluminum has a greater anti-corrosion property, there has been a constant development in the aluminum plating technologies. Currently, one of the existing aluminum plating technologies is vacuum deposition. Vacuum deposition of aluminum provides for a film of aluminum on the permanent Nd—Fe—B magnets that has a smooth surface; however, the film of aluminum has poor adhesion to the permanent Nd—Fe—B magnets. Another one of the existing aluminum plating technologies is a combination of multi-arc magnetron sputtering. Although multi-arc ion plating causes large particles of aluminum to be formed on the surface of the permanent Nd—Fe—B magnet, magnetron sputtering are used to patch the surface of the permanent Nd—Fe—B magnet to provide a smooth surface; however the efficiency of the depositing the film of aluminum on the permanent Nd—Fe—B magnet is low.

Through researching the multi-arc ion plating process, it was found that large particle of aluminum formation is caused by the low melting point of aluminum and the high temperature of the ion arc in the multi-arc ion plating process. As a result, the anti-corrosion properties for the film of aluminum are negatively affected. Although magnetron sputtering is used to patch the surface of the permanent Nd—Fe—B magnet to provide a smooth finish, the efficiency of the depositing the film of aluminum on the permanent Nd—Fe—B magnet is low. Typically, it takes approximately 5 hours to deposit the film of aluminum on the permanent Nd—Fe—B magnet.

Such a method is disclosed in Chinese Patent Publication CN101736304A. The method includes a first step of removing grease and dust from a permanent Nd—Fe—B magnet to produce a purified permanent Nd—Fe—B magnet. The next step of the method is disposing the purified permanent Nd—Fe—B magnet in a chamber of a multi-arc ion plating apparatus. After disposing the purified permanent Nd—Fe—B magnet in the chamber, air is removed from the chamber of the multi-arc ion plating apparatus to lower pressure in the chamber of the multi-arc ion plating apparatus to a first reduced pressure. Next, an electric potential is applied to the purified permanent Nd—Fe—B magnet in the chamber of the multi-arc ion plating apparatus to clean the purified permanent Nd—Fe—B magnet. A film of aluminum is then disposed on the purified permanent Nd—Fe—B magnet using an arc source to produce a coated permanent Nd—Fe—B magnet.

SUMMARY OF THE INVENTION

The invention provides for such a method including a step of cooling the chamber and the arc source of the multi-arc ion plating apparatus to lower and maintain the temperature of the arc source prior to the step of removing air from the chamber of the multi-arc ion plating apparatus to increase efficiency of the step of depositing the film of aluminum on the purified permanent Nd—Fe—B magnet.

ADVANTAGES OF THE INVENTION

The present invention overcomes the shortages of the existing technologies, and provides a method of depositing aluminum on a permanent Nd—Fe—B magnet.

The present invention provides a multi-arc ion plating method to deposit aluminum on a permanent Nd—Fe—B magnet, the purity of the aluminum being greater than 99%. By cooling the arc source of the multi-arc ion plating apparatus, the present invention reduces the amount of ion clusters formed at the arc source which reduces the formation of large liquids and large particles on the surface of the permanent Nd—Fe—B magnet and provides a smooth surface on the permanent Nd—Fe—B magnet.

The present invention also provides for an increased efficiency of depositing the film of aluminum on the purified permanent Nd—Fe—B magnet. The present invention further provides for the film of aluminum having improved adhesion to the permanent Nd—Fe—B magnet and a smoother surface on the permanent Nd—Fe—B magnet.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 1 is a schematic flow chart in accordance with the present invention.

DESCRIPTION OF THE ENABLING EMBODIMENT

Referring to the Figures, wherein like numerals indicate corresponding parts throughout the several views, it is one aspect of the present invention to provide a method for depositing aluminum on a permanent Nd—Fe—B magnet including grease and dust which is generally shown in FIG. 1. The method uses a multi-arc ion plating apparatus. The multi-arc ion plating apparatus defines a chamber and includes a target source of aluminum disposed in the chamber. A jig is disposed in the chamber and rotatably attached to the multi-arc ion plating apparatus. An arc source including a control magnet is disposed in the chamber of the multi-arc ion plating apparatus.

The first step of the method is removing grease and dust from a permanent Nd—Fe—B magnet to produce a purified permanent Nd—Fe—B magnet. The step of removing the grease and the dust further includes a step of washing the permanent Nd—Fe—B magnet using deionized water. After washing the permanent Nd—Fe—B magnet, the permanent Nd—Fe—B magnet is rinsed using an acidic solution including nitric acid being present in an amount between 3.0 wt. % and 5.0 wt. % to remove the grease. After removing the grease, the permanent Nd—Fe—B magnet is washed using the deionized water. The step of removing the grease and the dust further includes a step of subjecting the permanent Nd—Fe—B magnet to an ultrasonic rinsing process to remove the dust.

Because the deionized water used to wash the permanent Nd—Fe—B magnet may be retained in the permanent Nd—Fe—B magnet, the step of removing the grease and the dust further includes a step of removing the deionized water from the permanent Nd—Fe—B magnet by submerging the permanent Nd—Fe—B magnet in a solution including alcohol. The alcohol is present in the solution of at least 99 wt. % to remove the deionized water from the permanent Nd—Fe—B magnet. After removing the deionized water from the permanent Nd—Fe—B magnet, the permanent Nd—Fe—B magnet is air-dried to produce the purified permanent Nd—Fe—B magnet.

It should be appreciated that, prior to the step of removing the grease and the dust from the permanent Nd—Fe—B magnet, the method may include a step of sintering a permanent Nd—Fe—B magnet to densify the permanent Nd—Fe—B magnet. The step of sintering the permanent Nd—Fe—B magnet is further defined as diffusing a rare earth metal powder containing at least one of Terbium (Tb) and Dysprosium (Dy) into the permanent Nd—Fe—B magnet.

The next step of the method is drying the purified permanent Nd—Fe—B magnet in a furnace and at an elevated temperature of between 50° C. and 60° C. for a time duration of 30 minutes. Then, the purified permanent Nd—Fe—B magnet is disposed in a chamber of a multi-arc ion plating apparatus. The step of disposing the purified permanent Nd—Fe—B magnet in the chamber of the multi-arc ion plating apparatus is further defined as disposing the purified permanent Nd—Fe—B magnet on a jig in the chamber of the multi-arc ion plating apparatus. Following the step of disposing the purified permanent Nd—Fe—B magnet on the jig in the chamber of the multi-arc ion plating apparatus, the purified permanent Nd—Fe—B magnet on the jig is rotated in the chamber of the multi-arc ion plating apparatus.

Next, air is removed from the chamber of the multi-arc ion plating apparatus to lower pressure in the chamber of the multi-arc ion plating apparatus to a first reduced pressure. The step of removing air from the chamber of the multi-arc ion plating apparatus is further defined as removing air from the chamber of the multi-arc ion plating apparatus to lower pressure in the chamber of the multi-arc ion plating apparatus to the first reduced pressure of between $1.0 \times 10^{-2}$ Pa and $3.0 \times 10^{-2}$ Pa. After removing air, an inert gas is fed into the chamber of the multi-arc ion plating apparatus to increase pressure and provide an inert environment in the chamber of the multi-arc ion plating apparatus to a first raised pressure. The step of feed the inert gas into the chamber is further defined as feeding the inert gas containing Argon having a purity of at least 99.7% into the chamber of the multi-arc ion plating apparatus to increase pressure in the chamber of the multi-arc ion plating apparatus to the first raised pressure of between $1.0 \times 10^{-1}$ Pa and $5.0 \times 10^{-1}$ Pa.

After the inert gas is fed into the chamber of the multi-arc ion plating apparatus, an electric potential is applied to the purified permanent Nd—Fe—B magnet in the chamber of the multi-arc ion plating apparatus to clean the purified permanent Nd—Fe—B magnet. The step of applying the electric potential to the purified permanent Nd—Fe—B magnet is further defined as applying the electric potential between 800V and 1000V to the purified permanent Nd—Fe—B magnet in the chamber of the multi-arc ion plating apparatus for a time extent of between one minute and ten minutes to clean the purified permanent Nd—Fe—B magnet. It should be appreciated that, the electrical potential is generated by any means such as using a bias power supply.

After applying the electric potential, the method includes a step of further removing the air from the chamber of the multi-arc ion plating apparatus to lower pressure in the chamber of the multi-arc ion plating apparatus to a second reduced pressure. The step of further removing the air from the chamber is further defined as further removing the air from the chamber of the multi-arc ion plating apparatus to lower pressure in the chamber of the multi-arc ion plating apparatus to the second reduced pressure of between $1.0 \times 10^{-3}$ Pa and $9.0 \times 10^{-3}$ Pa. Then, the inert gas of argon further feeding the inert gas into the chamber of the multi-arc ion plating apparatus to increase pressure and provide the inert environment in the chamber of the multi-arc ion plating apparatus to a second raised pressure. The step of feeding the inert gas is further defined as further feeding the inert gas containing Argon having a purity of at least 99.7% into the chamber of the multi-arc ion plating apparatus to increase pressure and provide the inert environment in the chamber of the multi-arc ion plating apparatus to the second raised pressure of between $3.0 \times 10^{-1}$ Pa and $5.0 \times 10^{-1}$ Pa.

The next step of the method is depositing a film of aluminum on the purified permanent Nd—Fe—B magnet using an arc source to produce a coated permanent Nd—Fe—B magnet. The step of depositing the film of aluminum is further defined as depositing a film of aluminum having a thickness of between 2 μm and 40 μm using the arc source on the purified permanent Nd—Fe—B magnet. The coated permanent Nd—Fe—B magnet is then cooled in the chamber of the multi-arc ion plating apparatus to an intermediate temperature of between 20° C. and 100° C. After cooling, the coated permanent Nd—Fe—B magnet is removed from the chamber of the multi-arc ion plating apparatus and passivated. The step of passivating the coated permanent Nd—Fe—B magnet is further defined as submerging the coated permanent Nd—Fe—B magnet in a bath of passivating solution of aluminum and having a concentration of between 15% and 25% for a time span of between 1 minute and 20 minutes to produce a treated permanent Nd—Fe—B magnet.

The next step of the method is washing the treated permanent Nd—Fe—B magnet using deionized water and sealing the treated permanent Nd—Fe—B magnet. To seal the treated the permanent Nd—Fe—B magnet, the treated permanent Nd—Fe—B magnet is submerged in an electroplating sealing paint for a time frame of between 1 second and 20 seconds to produce a sealed permanent Nd—Fe—B magnet. Then, sealed permanent Nd—Fe—B magnet is removed and dried.

Prior to the step of removing air from the chamber of the multi-arc ion plating apparatus, the method includes a step of cooling the chamber and the arc source of the multi-arc ion plating apparatus to lower and maintain the temperature of the arc source to increase efficiency of the step of depositing the film of aluminum on the purified permanent Nd—Fe—B magnet. The step cooling the chamber and the arc source is further defined as feeding a fluid of water at a cooling temperature of between 0° C. and 5° C. through the chamber and the arc source.

Prior to the step of removing air from the chamber of the multi-arc ion plating apparatus, the method also includes a step of adjusting a target source of aluminum and a control magnet of the arc source in the chamber of the multi-arc ion plating apparatus to define a predetermined distance of between 1 cm and 10 cm between the target source of aluminum and the control magnet of the arc source to increase the arc movement produced by the arc source. It should be appreciated that the control magnet of the arc source is a N50 grade permanent magnet for controlling the movement of the arc source, e.g. rotational movements.

The step of depositing the film of aluminum further includes a step of applying a current of between 50 A and 70 A and an electrical potential of between 100V and 200V to the target source of aluminum to produce a plurality of ions of aluminum. In addition, the step of depositing the film of aluminum includes a step of directing the ions of aluminum using the arc source to the purified permanent Nd—Fe—B magnet for a time period of between 0.5 hours and 5 hours to produce the coated permanent Nd—Fe—B magnet.

For a better understanding and of the present invention, exemplary examples of the present invention are set forth below. The exemplary examples are for illustrative purpose only and do not in limit the scope of the present invention.

Implementing Example 1

For implementing example 1, aluminum is disposed on a conventionally sintered permanent Nd—Fe—B magnet including grease and dust. The grease and the dust are first removed from the permanent Nd—Fe—B magnet to produce a purified permanent Nd—Fe—B magnet. The step of removing the grease and the dust further includes a step of washing the permanent Nd—Fe—B magnet using deionized water. After washing the permanent Nd—Fe—B magnet, the permanent Nd—Fe—B magnet is rinsed using an acidic solution including nitric acid being present in an amount of 4.0 wt % to remove the grease. After removing the grease, the permanent Nd—Fe—B magnet is washed using the deionized water. The permanent Nd—Fe—B magnet is then subjected to an ultrasonic rinsing process to remove the dust.

Because the deionized water used to wash the permanent Nd—Fe—B magnet may be trapped in the permanent Nd—Fe—B magnet, the deionized water is removed by submerging the permanent Nd—Fe—B magnet in a solution including alcohol being present of 99.8 wt. %. The permanent Nd—Fe—B magnet is then air-dried to produce the purified permanent Nd—Fe—B magnet.

Next, the purified permanent Nd—Fe—B magnet is dried in a furnace and at an elevated temperature of 55° C. for a time duration of 30 minutes. After drying, the purified permanent Nd—Fe—B magnet is disposed on a jig in the chamber of the multi-arc ion plating apparatus. Next, the chamber and the arc source of the multi-arc ion plating apparatus is cooled by feeding a fluid of water at a cooling temperature of 3° C. The jig including the purified permanent Nd—Fe—B magnet is then rotated in the chamber of the multi-arc ion plating apparatus. After rotating the jig, a target source of aluminum and a control magnet including a N50 grade permanent magnet of the arc source in the chamber of the multi-arc ion plating apparatus are adjusted to define a predetermined distance of 5 cm between the target source of aluminum and the control magnet of the arc source to increase the arc movement produced by the arc source.

Next, air is removed from the chamber of the multi-arc ion plating apparatus to lower pressure in the chamber of the multi-arc ion plating apparatus to a first reduced pressure of $2.0 \times 10^{-2}$ Pa. After removing air, an inert gas containing Argon having a purity of 99.8% into the chamber of the multi-arc ion plating apparatus to increase pressure in the chamber of the multi-arc ion plating apparatus to a first raised pressure of $2.0 \times 10^{-1}$ Pa. Then, an electric potential of 900V is applied to the purified permanent Nd—Fe—B magnet in the chamber of the multi-arc ion plating apparatus for a time extent of five minutes to clean the purified permanent Nd—Fe—B magnet.

After applying the electric potential, air is further removed from the chamber to lower pressure in the chamber of the multi-arc ion plating apparatus to a second reduced pressure of $6.0 \times 10^{-3}$ Pa. Then, the inert gas containing Argon is further fed into the chamber of the multi-arc ion plating apparatus to increase pressure and provide the inert environment in the chamber of the multi-arc ion plating apparatus to the second raised pressure of $4.0 \times 10^{-1}$ Pa. Next, a film of aluminum having a thickness of 10 μm is disposed on the purified permanent Nd—Fe—B magnet by applying a current of 60 A and an electrical potential of 150V to the target source of aluminum to produce a plurality of ions of aluminum and directing the ions of aluminum using the arc source to the purified permanent Nd—Fe—B magnet for a time period of 1.5 hours to produce a coated permanent Nd—Fe—B magnet.

The coated permanent Nd—Fe—B magnet is then cooled in the chamber of the multi-arc ion plating apparatus to an intermediate temperature of 80° C. After cooling, the coated permanent Nd—Fe—B magnet is removed from the chamber of the multi-arc ion plating apparatus and passivated by submerging the coated permanent Nd—Fe—B magnet in a bath of passivating solution of aluminum and having a concentration of 20% for a time span of 10 minutes to produce a treated permanent Nd—Fe—B magnet.

The treated permanent Nd—Fe—B magnet is then washed using deionized water. After washing, the treated permanent Nd—Fe—B magnet is sealed by submerging the treated permanent Nd—Fe—B magnet in an electroplating sealing paint for a time frame of 10 seconds to produce a sealed permanent Nd—Fe—B magnet. Finally, the sealed permanent Nd—Fe—B magnet is removed and dried.

The resulting film of aluminum on the sealed permanent Nd—Fe—B magnet has a silver-white color and a smooth surface. There are no particles, black spots, air bubbles or peeling on the sealed permanent Nd—Fe—B magnet.

As set forth in the table below, the sealed permanent Nd—Fe—B magnet obtained from implementing example 1 is compared with permanent Nd—Fe—B magnets including a film of aluminum set forth in comparative examples 2, 3, and 4. In comparative example 2, the film of aluminum is deposited on the permanent Nd—Fe—B magnet by a multi-arc ion plating process. In comparative example 3, the film of aluminum is deposited on the permanent Nd—Fe—B magnet by a multi-arc magnetron sputtering process. In comparative example 4, the film of aluminum is deposited on the permanent Nd—Fe—B magnet by a magnetron sputtering process. The film of aluminum deposited under the same time period. The comparison tests include a neutral salt spraying test (SST) and a shear force test (SFT). The neutral salt spray test is conducted in accordance with the ISO 9227-2006 requirement by using a liquid containing 5 wt. % NaCl, at 35° C., and continuously sprayed. The shear force test is performed using Loctite® 3342 adhesive and 7380 curative agent, after curing for 1 hr at 90° C., the shear force test is performed using a Universal Shear Force Testing machine at a speed of 0.5 mm/s.

TABLE 1

| | Method of Plating | Thickness | Surface | SFT | SST |
|---|---|---|---|---|---|
| Implementing Example 1 | Present Invention | 10 μm | Smooth | 31 Mpa | 300 hrs with no Corrosion |
| Comparative Example 2 | Multi-arc ion plating process | 10 μm | Rough | 30 Mpa | Corrosion after 72 hrs |
| Comparative Example 3 | Multi-arc magnetron sputtering process | 5 μm | Smooth | 20 Mpa | Corrosion after 120 hrs |
| Comparative Example 4 | Magnetron sputtering process | <1 μm | Smooth | 12 Mpa | Corrosion after 12 hrs |

Implementing Example 2

For implementing example 2, aluminum is disposed on a permanent Nd—Fe—B magnet including grease and dust sintered by diffusing a rare earth metal powder containing Dysprosium (Dy) into the permanent Nd—Fe—B magnet. The grease and the dust are removed from the permanent Nd—Fe—B magnet to produce a purified permanent Nd—Fe—B magnet. The step of removing the grease and the dust further includes a step of washing the permanent Nd—Fe—B magnet using deionized water. After washing the permanent Nd—Fe—B magnet, the permanent Nd—Fe—B magnet is rinsed using an acidic solution including nitric acid being present in an amount of 3.0 wt % to remove the grease. After removing the grease, the permanent Nd—Fe—B magnet is washed using the deionized water. The permanent Nd—Fe—B magnet is then subjected to an ultrasonic rinsing process to remove the dust.

Because the deionized water used to wash the permanent Nd—Fe—B magnet may be trapped in the permanent Nd—Fe—B magnet, the deionized water is removed by submerging the permanent Nd—Fe—B magnet in a solution including alcohol being present of 99.1 wt. %. The permanent Nd—Fe—B magnet is then air-dried to produce the purified permanent Nd—Fe—B magnet.

Next, the purified permanent Nd—Fe—B magnet is dried in a furnace and at an elevated temperature of 50° C. for a time duration of 30 minutes. After drying, the purified permanent Nd—Fe—B magnet is disposed on a jig in the chamber of the multi-arc ion plating apparatus. Next, the chamber and the arc source of the multi-arc ion plating apparatus is cooled by feeding a fluid of water at a cooling temperature of 0° C. The jig including the purified permanent Nd—Fe—B magnet is then rotated in the chamber of the multi-arc ion plating apparatus. After rotating the jig, a target source of aluminum and a control magnet including a N50 grade permanent magnet of an arc source in the chamber of the multi-arc ion plating apparatus are adjusted to define a predetermined distance of 1 cm between the target source of aluminum and the control magnet of the arc source to increase the arc movement produced by the arc source.

Next, air is removed from the chamber of the multi-arc ion plating apparatus to lower pressure in the chamber of the multi-arc ion plating apparatus to a first reduced pressure of $1.0 \times 10^{-2}$ Pa. After removing air, an inert gas containing Argon having a purity of 99.71% into the chamber of the multi-arc ion plating apparatus to increase pressure in the chamber of the multi-arc ion plating apparatus to a first raised pressure of $1.0 \times 10^{-1}$ Pa. Then, an electric potential of 800V is applied to the purified permanent Nd—Fe—B magnet in the chamber of the multi-arc ion plating apparatus for a time extent of 1 minute to clean the purified permanent Nd—Fe—B magnet.

After applying the electric potential, air is further removed from the chamber to lower pressure in the chamber of the multi-arc ion plating apparatus to a second reduced pressure of $1.0 \times 10^{-3}$ Pa. Then, the inert gas containing Argon is further fed into the chamber of the multi-arc ion plating apparatus to increase pressure and provide the inert environment in the chamber of the multi-arc ion plating apparatus to the second raised pressure of $3.0 \times 10^{-1}$ Pa. Next, a film of aluminum having a thickness of 2 μm is disposed on the purified permanent Nd—Fe—B magnet by applying a current of 50 A and an electrical potential of 100V to the target source of aluminum to produce a plurality of ions of aluminum and directing the ions of aluminum using the arc source to the purified permanent Nd—Fe—B magnet for a time period of 0.5 hours to produce a coated permanent Nd—Fe—B magnet.

The coated permanent Nd—Fe—B magnet is then cooled in the chamber of the multi-arc ion plating apparatus to an intermediate temperature of 20° C. After cooling, the coated permanent Nd—Fe—B magnet is removed from the chamber of the multi-arc ion plating apparatus and passivated by submerging the coated permanent Nd—Fe—B magnet in a bath of passivating solution of aluminum and having a concentration of 15% for a time span of 1 minute to produce a treated permanent Nd—Fe—B magnet.

The treated permanent Nd—Fe—B magnet is then washed using deionized water. After washing, the treated permanent Nd—Fe—B magnet is sealed by submerging the treated permanent Nd—Fe—B magnet in an electroplating sealing paint for a time frame of 1 second to produce a sealed permanent Nd—Fe—B magnet. Finally, the sealed permanent Nd—Fe—B magnet is removed and dried.

The resulting film of aluminum on the sealed permanent Nd—Fe—B magnet has a silver-white color and a smooth surface. There are no particles, black spots, air bubbles or peeling on the sealed permanent Nd—Fe—B magnet.

As set forth in the table below, the sealed permanent Nd—Fe—B magnet obtained from implementing example 2 is compared with permanent Nd—Fe—B magnets including a film of aluminum set forth in comparative examples 5, 6, and 7. In comparative example 5, the film of aluminum is deposited on the permanent Nd—Fe—B magnet by a multi-arc ion plating process. In comparative example 6, the film of aluminum is deposited on the permanent Nd—Fe—B magnet by a multi-arc magnetron sputtering process. In comparative example 7, the film of aluminum is deposited on the permanent Nd—Fe—B magnet by a magnetron sputtering process. The film of aluminum deposited under the same time period. The comparison tests include a neutral salt spraying test (SST) and a shear force test (SFT). The neutral salt spray test is conducted in accordance with the ISO 9227-2006 requirement by using a liquid containing 5 wt. % NaCl, at 35° C., and continuously sprayed. The shear force test is performed using Loctite® 3342 adhesive and 7380 curative agent, after curing for 1 hr at 90° C., the shear force test is performed using a Universal Shear Force Testing machine at a speed of 0.5 mm/s.

TABLE 2

| | Method of Plating | Thickness | Surface | SFT | SST |
|---|---|---|---|---|---|
| Implementing Example 2 | Present Invention | 2 μm | Smooth | 33 Mpa | 120 hrs with no Corrosion |
| Comparative Example 5 | Multi-arc ion plating process | 2 μm | Rough | 30 Mpa | Corrosion after 12 hrs |
| Comparative Example 6 | Multi-arc magnetron sputtering process | 1 μm | Smooth | 22 Mpa | Corrosion after 24 hrs |
| Comparative Example 7 | Magnetron sputtering process | <1 μm | Smooth | 10 Mpa | Corrosion after 6 hrs |

Implementing Example 3

For implementing example 3, aluminum is disposed on a permanent Nd—Fe—B magnet including grease and dust sintered by diffusing a rare earth metal powder containing Terbium (Tb) into the permanent Nd—Fe—B magnet. The grease and the dust are removed from the permanent Nd—Fe—B magnet to produce a purified permanent Nd—Fe—B magnet. The step of removing the grease and the dust further includes a step of washing the permanent Nd—Fe—B magnet using deionized water. After washing the permanent Nd—Fe—B magnet, the permanent Nd—Fe—B magnet is rinsed using an acidic solution including nitric acid being present in an amount of 5.0 wt % to remove the grease. After removing the grease, the permanent Nd—Fe—B magnet is washed using the deionized water. The permanent Nd—Fe—B magnet is then subjected to an ultrasonic rinsing process to remove the dust.

Because the deionized water used to wash the permanent Nd—Fe—B magnet may be trapped in the permanent Nd—Fe—B magnet, the deionized water is removed by submerging the permanent Nd—Fe—B magnet in a solution including alcohol being present of 99.9 wt %. The permanent Nd—Fe—B magnet is then air-dried to produce the purified permanent Nd—Fe—B magnet.

Next, the purified permanent Nd—Fe—B magnet is dried in a furnace and at an elevated temperature of 60° C. for a time duration of 30 minutes. After drying, the purified permanent Nd—Fe—B magnet is disposed on a jig in the chamber of the multi-arc ion plating apparatus. Next, the chamber and the arc source of the multi-arc ion plating apparatus are cooled by feeding a fluid of water at a cooling temperature of 5° C. The jig including the purified permanent Nd—Fe—B magnet is then rotated in the chamber of the multi-arc ion plating apparatus. After rotating the jig, a target source of aluminum and a control magnet including a N50 grade permanent magnet of an arc source in the chamber of a multi-arc ion plating apparatus are adjusted to define a predetermined distance of 10 cm between the target source of aluminum and the control magnet of the arc source to increase the arc movement produced by the arc source.

Next, air is removed from the chamber of the multi-arc ion plating apparatus to lower pressure in the chamber of the multi-arc ion plating apparatus to a first reduced pressure of $3.0 \times 10^{-2}$ Pa. After removing air, an inert gas containing Argon having a purity of 99.9% into the chamber of the multi-arc ion plating apparatus to increase pressure in the chamber of the multi-arc ion plating apparatus to a first raised pressure of $5.0 \times 10^{-1}$ Pa. Then, an electric potential of 1000V is applied to the purified permanent Nd—Fe—B magnet in the chamber of the multi-arc ion plating apparatus for a time extent of 10 minutes to clean the purified permanent Nd—Fe—B magnet.

After applying the electric potential, air is further removed from the chamber to lower pressure in the chamber of the multi-arc ion plating apparatus to a second reduced pressure of $8.0 \times 10^{-3}$ Pa. Then, the inert gas containing Argon is further fed into the chamber of the multi-arc ion plating apparatus to increase pressure and provide the inert environment in the chamber of the multi-arc ion plating apparatus to the second raised pressure of $5.0 \times 10^{-1}$ Pa. Next, a film of aluminum having a thickness of 40 μm is disposed on the purified permanent Nd—Fe—B magnet by applying a current of 70 A and an electrical potential of 200V to the target source of aluminum to produce a plurality of ions of aluminum and directing the ions of aluminum using the arc source to the purified permanent Nd—Fe—B magnet for a time period of 5 hours to produce a coated permanent Nd—Fe—B magnet.

The coated permanent Nd—Fe—B magnet is then cooled in the chamber of the multi-arc ion plating apparatus to an intermediate temperature of 100° C. After cooling, the coated permanent Nd—Fe—B magnet is removed from the chamber of the multi-arc ion plating apparatus and passivated by submerging the coated permanent Nd—Fe—B magnet in a bath of passivating solution of aluminum and having a concentration of 25% for a time span of 20 minutes to produce a treated permanent Nd—Fe—B magnet.

The treated permanent Nd—Fe—B magnet is then washed using deionized water. After washing, the treated permanent Nd—Fe—B magnet is sealed by submerging the treated permanent Nd—Fe—B magnet in an electroplating sealing paint for a time frame of 20 seconds to produce a sealed permanent Nd—Fe—B magnet. Finally, the sealed permanent Nd—Fe—B magnet is removed and dried.

The resulting film of aluminum on the sealed permanent Nd—Fe—B magnet has a silver-white color and a smooth surface. There are no particles, black spots, air bubbles or peeling on the sealed permanent Nd—Fe—B magnet.

As set forth in the table below, the sealed permanent Nd—Fe—B magnet obtained from implementing example 3 is compared with permanent Nd—Fe—B magnets including a film of aluminum set forth in comparative examples 8, 9, and 10. In comparative example 8, the film of aluminum is deposited on the permanent Nd—Fe—B magnet by a multi-arc ion plating process. In comparative example 9, the film of aluminum is deposited on the permanent Nd—Fe—B magnet by a multi-arc magnetron sputtering process. In comparative example 10, the film of aluminum is deposited on the permanent Nd—Fe—B magnet by a magnetron sputtering process. The film of aluminum deposited under the same time period. The comparison tests include a neutral salt spraying test (SST) and a shear force test (SFT). The neutral salt spray test is conducted in accordance with the ISO 9227-2006 requirement by using a liquid containing 5 wt. % NaCl, at 35° C., and continuously sprayed. The shear force test is performed using Loctite® 3342 adhesive and 7380 curative agent, after curing for 1 hr at 90° C., the shear force test is performed using a Universal Shear Force Testing machine at a speed of 0.5 mm/s.

TABLE 3

| | Method of Plating | Thickness | Surface | SFT | SST |
|---|---|---|---|---|---|
| Implementing Example 3 | Present Invention | 40 μm | Smooth | 33 Mpa | 960 hrs with no Corrosion |
| Comparative Example 8 | Multi-arc ion plating process | 40 μm | Rough | 30 Mpa | Corrosion after 96 hrs |
| Comparative Example 9 | Multi-arc magnetron sputtering process | 22 μm | Smooth | 22 Mpa | Corrosion after 300 hrs |
| Comparative Example 10 | Magnetron sputtering process | 2 μm | Smooth | 10 Mpa | Corrosion after 48 hrs |

As indicated by Table 1, Table 2, and Table 3, depositing aluminum on the permanent Nd—Fe—B magnet in accordance with the present invention provides for a better efficiency, a smoother surface on the permanent Nd—Fe—B magnet, and improved corrosion resistance.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A method for depositing aluminum on a permanent Nd—Fe—B magnet including grease and dust, using a multi-arc ion plating apparatus defining a chamber and including a target source of aluminum disposed in the chamber and an arc source including a control magnet disposed in the chamber, said method comprising the steps of;
   removing grease and dust from a permanent Nd—Fe—B magnet to produce a purified permanent Nd—Fe—B magnet,
   disposing the purified permanent Nd—Fe—B magnet in a chamber of a multi-arc ion plating apparatus,
   removing air from the chamber of the multi-arc ion plating apparatus to lower pressure in the chamber of the multi-arc ion plating apparatus to a first reduced pressure,
   applying an electric potential to the purified permanent Nd—Fe—B magnet in the chamber of the multi-arc ion plating apparatus to clean the purified permanent Nd—Fe—B magnet,
   depositing a film of aluminum on the purified permanent Nd—Fe—B magnet using the arc source including the control magnet of a N50 grade permanent magnet to produce a coated permanent Nd—Fe—B magnet,
   cooling the chamber and the arc source including the control magnet of the N50 grade permanent magnet of the multi-arc ion plating apparatus to lower and maintain the temperature of the arc source prior to said step of removing air from the chamber of the multi-arc ion plating apparatus to increase efficiency of said step of depositing the film of aluminum on the purified permanent Nd—Fe—B magnet.

2. The method as set forth in claim 1 wherein said step cooling the chamber and the arc source is further defined as feeding a fluid of water at a cooling temperature of between 0° C. and 5° C. through the chamber and the arc source.

3. The method as set forth in claim 1 further includes a step of adjusting a target source of aluminum and a control magnet of the arc source in the chamber of the multi-arc ion plating apparatus to define a predetermined distance of between 1 cm and 10 cm between the target source of aluminum and the control magnet of the arc source to increase the arc movement produced by the arc source after said step of cooling the chamber and the arc source.

4. The method as set forth in claim 1 wherein said step of depositing the film of aluminum is further defined as depositing a film of aluminum having a thickness of between 2 μm and 40 μm using the arc source on the purified permanent Nd—Fe—B magnet.

5. The method as set forth in claim 4 wherein said step of depositing the film of aluminum further includes a step of applying a current of between 50 A and 70 A and an electrical potential of between 100V and 200V to the target source of aluminum to produce a plurality of ions of aluminum.

6. The method as set forth in claim 5 wherein said step of depositing the film of aluminum further includes a step of directing the ions of aluminum using the arc source to the purified permanent Nd—Fe—B magnet for a time period of between 0.5 hours and 5 hours to produce the coated permanent Nd—Fe—B magnet.

7. The method as set forth in claim 1 further includes a step of sintering the permanent Nd—Fe—B magnet to densify the permanent Nd—Fe—B magnet prior to said step of removing the grease and the dust.

8. The method as set forth in claim 7 wherein said step of sintering permanent Nd—Fe—B magnet is further defined as diffusing a rare earth metal powder containing at least one of Terbium and Dysprosium into the permanent Nd—Fe—B magnet.

9. The method as set forth in claim 1 further includes a step of passivating the coated permanent Nd—Fe—B magnet by submerging the coated permanent Nd—Fe—B magnet in a bath of passivating solution of aluminum and having a concentration of between 15% and 25% for a time span of between 1 minute and 20 minutes to produce a treated permanent Nd—Fe—B magnet.

10. The method as set forth in claim 1 further includes a step of sealing the treated permanent Nd—Fe—B magnet by submerging the treated permanent Nd—Fe—B magnet to an electroplating sealing paint for a time frame of between 1 second and 20 seconds to produce a sealed permanent Nd—Fe—B magnet.

11. The method as set forth in claim 1 wherein said step of removing air from the chamber of the multi-arc ion plating apparatus is further defined as removing air from the chamber of the multi-arc ion plating apparatus to lower pressure in the chamber of the multi-arc ion plating apparatus to the first reduced pressure of between $1.0 \times 10^{-2}$ Pa and $3.0 \times 10^{-2}$ Pa.

12. The method as set forth in claim 11 further includes a step of feed an inert gas containing Argon having a purity of at least 99.7% into the chamber of the multi-arc ion plating apparatus to increase pressure and provide an inert environment in the chamber of the multi-arc ion plating apparatus to a first raised pressure of between $1.0 \times 10^{-1}$ Pa and $5.0 \times 10^{-1}$ Pa after said step of removing air from the chamber.

13. The method as set forth in claim 12 further includes a step of further removing the air from the chamber of the multi-arc ion plating apparatus to lower pressure in the chamber of the multi-arc ion plating apparatus to a second reduced pressure of between $1.0 \times 10^{-3}$ Pa and $9.0 \times 10^{-3}$ Pa after said step of applying the electric potential.

14. The method as set forth in claim 13 further includes a step of further feeding the inert gas containing Argon having a purity of at least 99.7% into the chamber of the multi-arc ion plating apparatus to increase pressure and provide the inert environment in the chamber of the multi-arc ion plating apparatus to a second raised pressure of between $3.0 \times 10^{-1}$ Pa and $5.0 \times 10^{-1}$ Pa.

15. The method as set forth in claim 1 wherein said step of applying the electric potential to the purified permanent Nd—Fe—B magnet is further defined as applying the electric potential between 800V and 1000V to the purified permanent Nd—Fe—B magnet in the chamber of the multi-arc ion plating apparatus for a time extent of between 1 and 10 minutes to clean the purified permanent Nd—Fe—B magnet.

16. The method as set forth in claim 1 wherein said step of removing the grease and the dust further includes steps of washing the permanent Nd—Fe—B magnet using deionized water,
rinsing the permanent Nd—Fe—B magnet using an acidic solution including nitric acid being present in an amount between 3 wt. % and 5 wt. % to remove the grease,
washing the permanent Nd—Fe—B magnet using the deionized water after said step of rinsing the permanent Nd—Fe—B magnet,
subjecting the permanent Nd—Fe—B magnet to an ultrasonic rinsing process to remove the dust,
removing the deionized water from the permanent Nd—Fe—B magnet.

17. The method as set forth in claim 16 wherein said step of removing the deionized water from the permanent Nd—Fe—B magnet is further defined as submerging the permanent Nd—Fe—B magnet in a solution including alcohol being present of at least 99 wt. % to remove the deionized water from the permanent Nd—Fe—B magnet.

18. The method as set forth in claim 17 wherein said step of removing the deionized water further including a step of air-drying the permanent Nd—Fe—B magnet after said step of removing the deionized water from the permanent Nd—Fe—B magnet to produce the purified permanent Nd—Fe—B magnet.

19. A method for depositing aluminum on a permanent Nd—Fe—B magnet including grease and dust, using a multi-arc ion plating apparatus defining a chamber and a target source of aluminum disposed in the chamber and an arc source including a control magnet disposed in the chamber, said method comprising the steps of:
removing grease and dust from a permanent Nd—Fe—B magnet to produce a purified permanent Nd—Fe—B magnet,
disposing the purified permanent Nd—Fe—B magnet in a chamber of a multi-arc ion plating apparatus,
removing air from the chamber of the multi-arc ion plating apparatus to lower pressure in the chamber of the multi-arc ion plating apparatus to a first reduced pressure,
feeding an inert gas into the chamber of the multi-arc ion plating apparatus to increase pressure in the chamber of the multi-arc ion plating apparatus to a first raised pressure and provide an inert environment in the chamber of the multi-arc ion plating apparatus,
applying an electric potential to the purified permanent Nd—Fe—B magnet in the chamber of the multi-arc ion plating apparatus to clean the purified permanent Nd—Fe—B magnet, further removing air from the chamber of the multi-arc ion plating apparatus to lower pressure in the chamber of the multi-arc ion plating apparatus to a second reduced pressure,
further feeding an inert gas into the chamber of the multi-arc ion plating apparatus to increase pressure in the chamber of the multi-arc ion plating apparatus to a second raised pressure and provide the inert environment in the chamber of the multi-arc ion plating apparatus,
depositing a film of aluminum on the purified permanent Nd—Fe—B magnet using the arc source including the control magnet of a N50 grade permanent magnet to produce a coated permanent Nd—Fe—B magnet,
passivating the coated permanent Nd—Fe—B magnet to produce a treated permanent Nd—Fe—B magnet,
sealing the treated permanent Nd—Fe—B magnet,
cooling the chamber and the arc source including the control magnet of a N50 grade permanent magnet of the multi-arc ion plating apparatus to lower and maintain the temperature of the arc source prior to said step of removing air from the chamber of the multi-arc ion plating apparatus to increase efficiency of said step of depositing the film of aluminum on the purified permanent Nd—Fe—B magnet.

20. The method as set forth in claim 19 wherein said step cooling the chamber and the arc source is further defined as feeding a fluid of water at a cooling temperature of between 0° C. and 5° C. through the chamber and the arc source.

21. The method as set forth in claim 19 further includes a step of adjusting a target source of aluminum and a control magnet of the arc source in the chamber of the multi-arc ion plating apparatus to define a predetermined distance of between 1 cm and 10 cm between the target source of aluminum and the control magnet of the arc source to increase the arc movement produced by the arc source after said step of cooling the chamber and the arc source.

22. The method as set forth in claim 19 wherein said step of depositing the film of aluminum is further defined as depositing a film of aluminum having a thickness of between 2 μm and 40 μm using the arc source on the purified permanent Nd—Fe—B magnet.

23. The method as set forth in claim 22 wherein said step of depositing the film of aluminum further includes a step of applying a current of between 50 A and 70 A and an electrical potential of between 100V and 200V to the target source of aluminum to produce a plurality of ions of aluminum.

24. The method as set forth in claim 23 wherein said step of depositing the film of aluminum further includes a step of directing the ions of aluminum using the arc source to the purified permanent Nd—Fe—B magnet for a time period of between 0.5 hours and 5 hours to produce the coated permanent Nd—Fe—B magnet.

* * * * *